(12) United States Patent
Hashimoto et al.

(10) Patent No.: US 6,301,115 B1
(45) Date of Patent: Oct. 9, 2001

(54) HEAT SINK DEVICES FOR USE IN ELECTRONIC DEVICES

(75) Inventors: Suzushi Hashimoto, Kawachi-gun; Tomio Ito, Oyama, both of (JP)

(73) Assignee: Showa Aluminum Corporation, Osaka (JP)

( * ) Notice: Subject to any disclaimer, the term of this patent is extended or adjusted under 35 U.S.C. 154(b) by 0 days.

(21) Appl. No.: 09/685,558

(22) Filed: Oct. 11, 2000

(30) Foreign Application Priority Data

Oct. 12, 1999 (JP) .................................................. 11-289476

(51) Int. Cl.⁷ ........................................................ H05K 7/20
(52) U.S. Cl. ........................... 361/704; 361/690; 361/695; 361/703; 361/707; 361/709; 361/719; 174/16.3; 257/712; 257/713; 257/718; 257/719; 257/721; 257/722; 257/727; 165/80.3
(58) Field of Search ..................... 361/687, 690, 361/695, 700, 703, 704, 707, 709, 715, 719; 257/706, 710–719, 726, 727; 165/80.2, 80.3, 185

(56) References Cited

U.S. PATENT DOCUMENTS

| 5,841,633 | * | 11/1998 | Huang | 361/695 |
| 6,008,990 | * | 12/1999 | Liu | 361/704 |
| 6,097,601 | * | 8/2000 | Lee | 361/704 |
| 6,141,220 | * | 10/2000 | Lin | 361/704 |

* cited by examiner

Primary Examiner—Leo P. Picard
Assistant Examiner—Boris L. Chervinsky
(74) Attorney, Agent, or Firm—Armstrong, Westerman, Hattori, McLeland & Naughton, LLP (57) ABSTRACT

A heat sink device for use in desktop electronic devices comprises a heat sink which can be firmly attached to a CPU assembly with extremely great strength. The holes to be formed in the CPU circuit board of the CPU assembly or the heat sink can be made as small as possible to ensure a great advantage in design. Fastening members, connecting pins or like fasteners used are unlikely to project beyond the outer surface of the CPU assembly to ensure compactness. Furthermore, the heat sink device achieves a high radiation efficiency and is less costly to manufacture.

2 Claims, 11 Drawing Sheets

HEAT SINK DEVICES FOR USE IN ELECTRONIC DEVICES

BACKGROUND OF THE INVENTION

The present invention relates to heat sink devices for use in electronic devices, for example, to those for releasing the heat generated by CPU assemblies in desktop electronic devices to outside the housing.

In order to release the heat generated by CPU assemblies disposed in the housings of electronic devices to outside the housing, a heat sink, for example, of aluminum is conventionally attached to the CPU assembly. For example, Japanese Utility Model Registration No. 3054704 discloses a known device for connecting the heat sink to the CPU assembly.

Conventional heat sink devices for use in electronic devices include fastening members for connecting the heat sink to the CPU assembly. However, these fastening members are complicated in shape and low in fastening strength. Further a space portion of predetermined width is conventionally formed in the radiating finned surface of the heat sink for fitting the fastening member therein. The provision of the space portion therefore entails the problem of correspondingly reducing the number or size of radiating fins to result in a lower radiation efficiency. The conventional fastening member has at one end thereof a portion inserted through holes in the heat sink and the CPU assembly and fixed in place by being bent at its outer end projecting outward beyond the outer surface of the CPU assembly. Accordingly, connecting the heat sink to the CPU assembly requires a cumbersome procedure. Further because the inserted portion of the conventional fastening member usually has a width of about 5 mm, the hole in the CPU assembly must be as large as at least 6 mm in diameter. This entails the problem that the CPU circuit board needs a corresponding larger space for drilling such holes, hence a disadvantage in design. It is desired that the holes to be formed in the circuit board of the CPU assembly, the heat sink, etc. be as small as possible. Preferable are, for example, holes having a diameter of up to 3 mm.

SUMMARY OF THE INVENTION

An object of the present invention is to provide a heat sink device for use in electronic devices which is free of the foregoing problems.

The present invention provides a heat sink device for use in electronic devices which is of the type having a header portion at one side and which is adapted to release the heat generated by a CPU assembly disposed in the housing of the electronic device to the outside of the housing. The heat sink device for the electronic device is characterized in that a heat dissipating base plate of a heat sink has radiating fins on a lower surface of the base plate and a slot formed in an upper surface of the base plate and extending transversely thereof, a mount frame member being fitted to the base plate and provided with upright walls projecting upward respectively from front and rear opposite edge portions thereof and opposed to each other, the front and rear upright walls being each provided at an upper end portion thereof with an engaging projection and a fitting furrow positioned under and extending along the engaging projection, a fastening member having a striplike base fitted in the slot of the base plate of the heat sink and pinlike projections each projecting upward from a longitudinal intermediate portion of the striplike base, the radiating fins of the heat sink being inserted from above through an opening of the mount frame member to fit a lower half portion of the base plate into the opening, the base plate being provided at front and rear ends thereof with stepped portions engaged respectively with a front edge and a rear edge of the mount frame member defining the opening thereof, the CPU assembly being placed on the upper surface of the base plate of the heat sink, the fastening member having each of the pinlike projections thereof inserted from below through a hole in the CPU assembly, a circuit board of the CPU assembly having front and rear edge portions fixedly engaged with the respective engaging projections of the front and rear upright walls of the mount frame member while being fitted in the respective fitting furrows of the upright walls.

The present invention provides another heat sink device for releasing the heat generated by a CPU assembly disposed in the housing of an electronic device to the outside of the housing. The heat sink device for the electronic device is characterized in that a heat dissipating base plate of a heat sink has radiating fins on a lower surface of the base plate and a slot formed in an upper surface of the base plate and extending transversely thereof, a mount frame member being fitted to the base plate and provided with engaging projections projecting upward from respective upper edges of opposite side walls thereof for closing opposite ends of the slot in the base plate respectively, a fastening member having a striplike base fitted in the slot of the base plate of the heat sink and provided with protuberant portions, each of the protuberant portions having in a top part thereof a slit extending longitudinally thereof and a circular hole having a large diameter and communicating with one end of the slit, connecting pins being inserted through respective holes in the CPU assembly while being prevented from slipping off downward, each of the connecting pins having at a lower end thereof an engaging head projecting downward beyond a circuit board of the CPU assembly, the radiating fins of the heat sink being inserted from above through an opening of the mount frame member to fit a lower half portion of the base plate into the opening, an upper half portion of the base plate having a front edge and a rear edge engaged respectively with a front edge and a rear edge of the mount frame member defining the opening thereof, the engaging projections at the upper edges of the opposite side walls of the mount frame member being pressed inward and thereby deformed while closing the opposite ends of the slot of the heat sink base plate so as to be partly positioned in the respective slot ends and to connect the base plate to the mount frame member by the inwardly deformed projections, the CPU assembly having the connecting pins attached thereto and being placed on the upper surface of the heat sink base plate, the engaging head of each connecting pin being moved toward the slit in the protuberant portion of the fastening member base after the engaging head is inserted into the circular hole in the protuberant portion, whereby the engaging head of the pin is held by the fastening member in engagement therewith.

In the case of either of these heat sink devices, the heat sink can be firmly attached to the CPU assembly with extremely great strength. Moreover, the holes to be formed in the CPU circuit board of the CPU assembly or the heat sink can be made as small as possible, for example, with a diameter of not greater than 3 mm to ensure a great advantage in design and to meet requirements of the industry relating to electronic devices of the type mentioned. Furthermore, the fastening members, connecting pins or like fasteners are unlikely to project beyond the outer surface of the CPU assembly to ensure compactness, while the heat sink devices of the invention achieve a high radiation efficiency and are less costly to manufacture.

The present invention will be described in greater detail with reference to the accompanying drawings.

DESCRIPTION OF THE PREFERRED EMBODIMENTS

Throughout the drawings, like parts are designated by like reference numerals.

Figure 1:
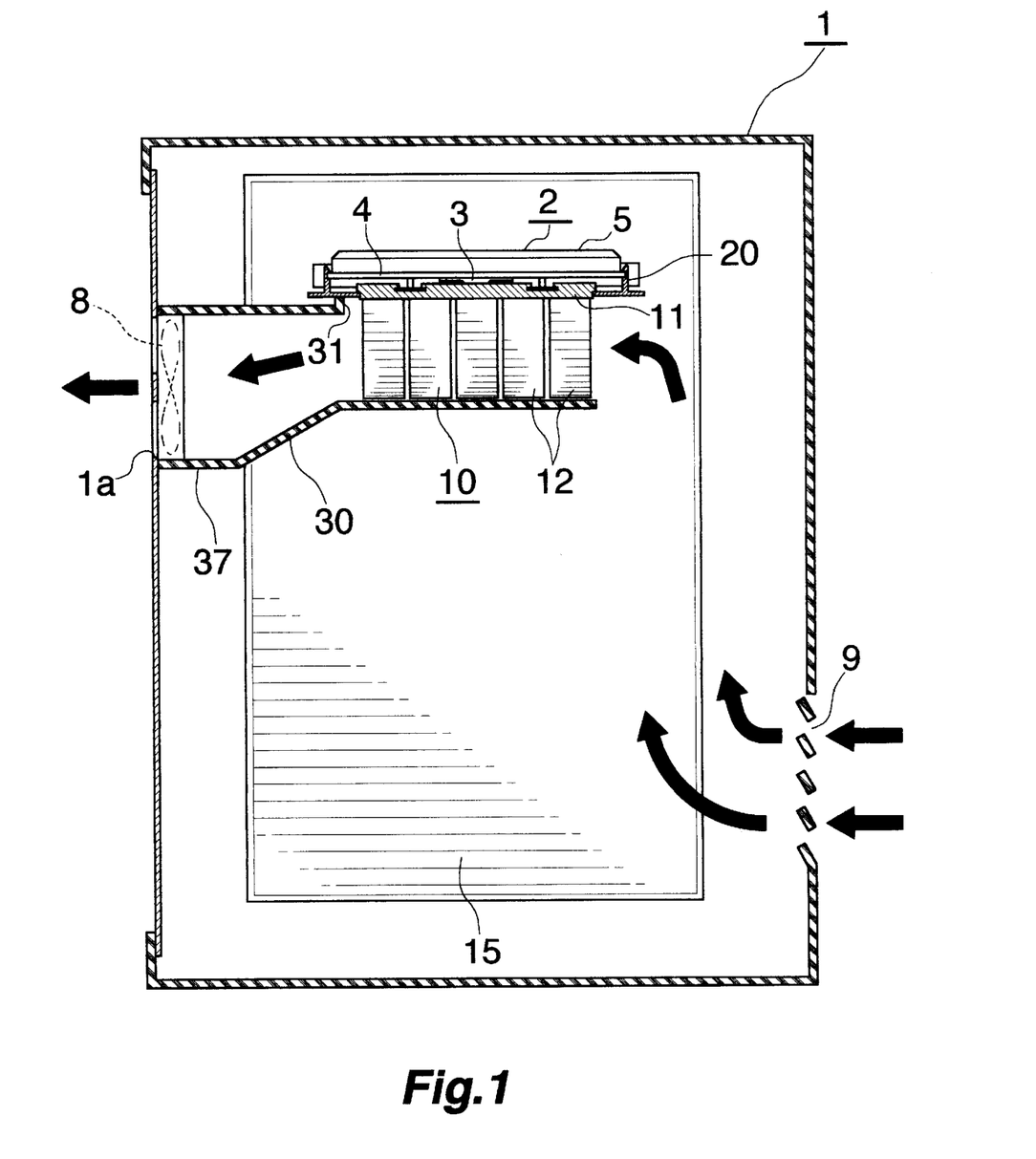
FIG. 1 is an overall view in section schematically showing a desktop tower-type personal computer (electronic device) equipped with a heat sink device of the invention.

The terms "front," "rear," "left," "right," "upper" and "lower" as used herein are based on FIG. 1; "front" refers to the right-hand side of FIG. 1, and "rear" to the left-hand side thereof. The terms "left" and "right" are used for the device as it is seen from the front rearward. "Upper" refers to the upper side of FIG. 1, and "lower" to the lower side thereof.

Further the term "aluminum" as used hereinafter includes aluminum alloys in addition to pure aluminum.

FIGS. 1 to 6 show a first embodiment of the present invention. FIG. 1 is an overall view schematically showing a desktop tower-type personal computer (electronic device) equipped with a heat sink device of the invention. Provided in an upper portion of the interior of the housing 1 of the computer is a CPU assembly 2 comprising a CPU (electronic component) 3.

The CPU assembly 2 is of the so-called cartridge type. The CPU 3 is attached as exposed to the lower surface of a CPU circuit board 4, the upper surface of which is covered with a synthetic resin cover 5.

A heat sink 10 of aluminum is attached to the lower side of the CPU assembly 2 by a mount frame member 20 made of an aluminum extrudate so as to be in direct contact with the CPU 3. The heat sink 10 and the CPU assembly 2 are attached to the upper side of a synthetic resin duct 30 having a rectangular cross section and disposed in the upper interior portion of the housing 1.

The housing 1 has a rear wall provided with a heat release opening 1a in an upper portion thereof. The duct 30 has an enlarged outer end 37 opposed to the opening 1a. Provided inside the duct end 37 is a fan 8 for sending out air from inside the housing 1 to the outside. The housing 1 has a front wall provided in a lower portion thereof with an air inlet 9 for taking in cooling air therethrough.

Figure 2:
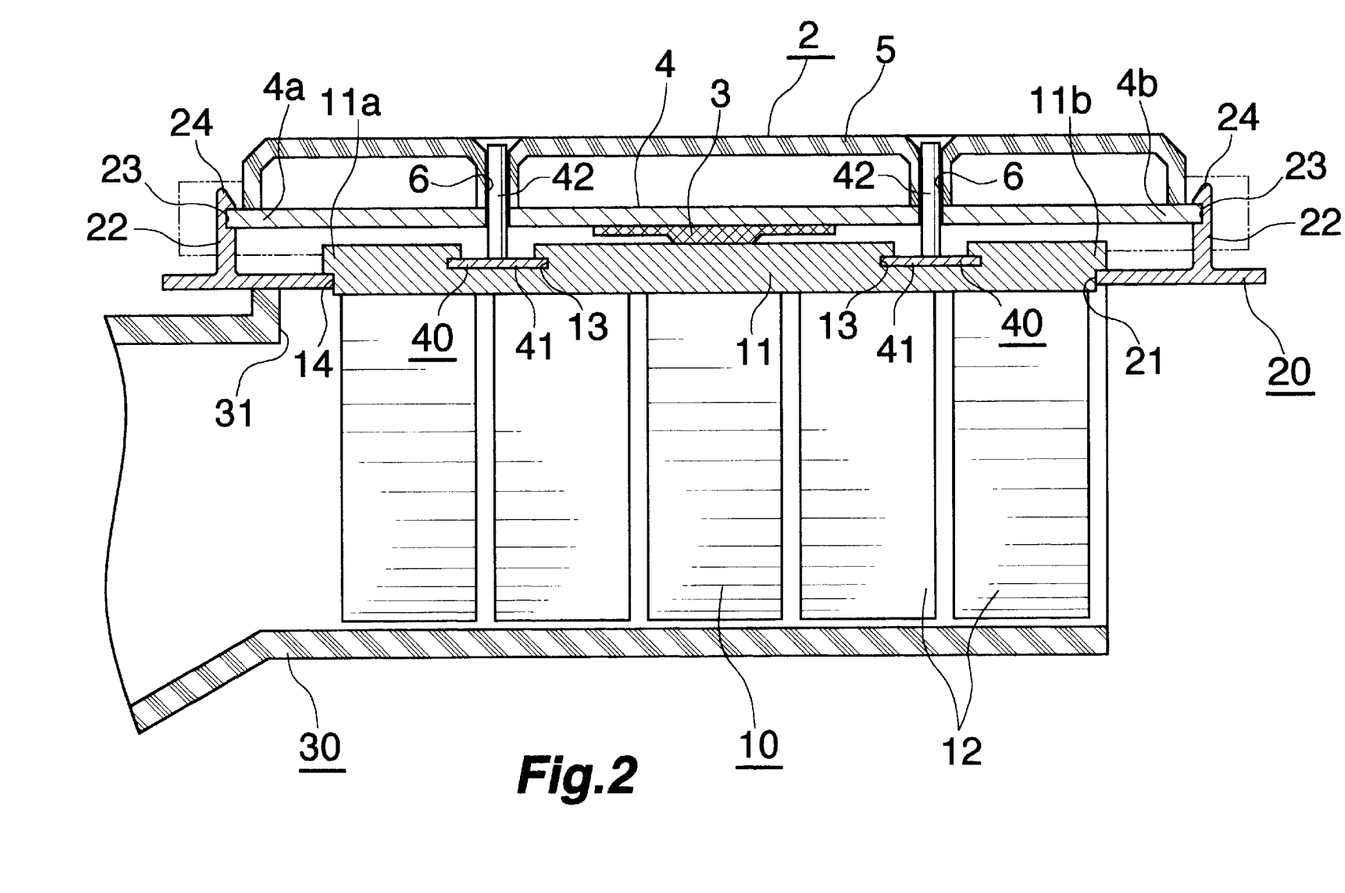
FIG. 2 is an enlarged view in longitudinal section showing a first embodiment of heat sink device of the invention.
Figure 3:
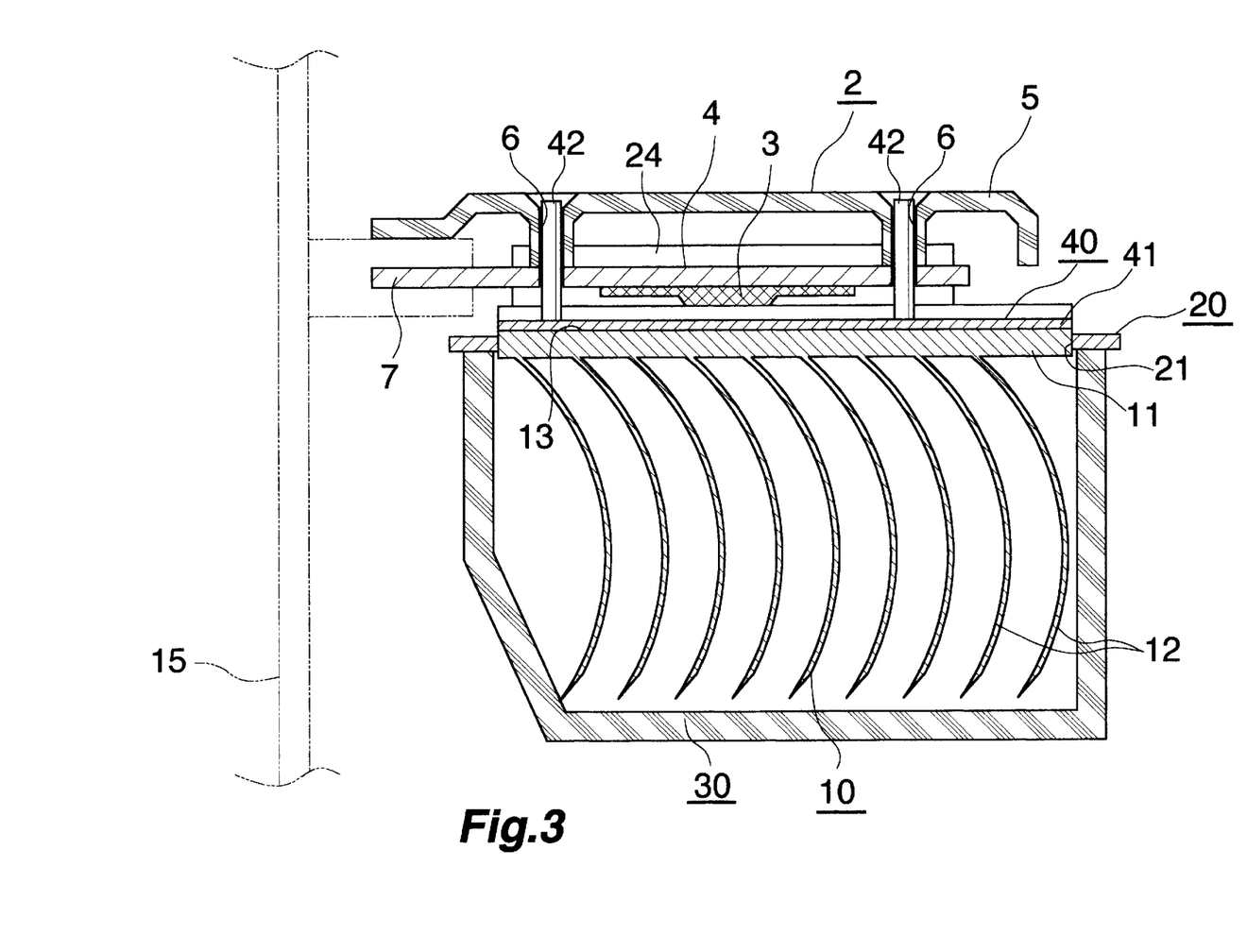
FIG. 3 is an enlarged view in cross section of the same.
Figure 4:
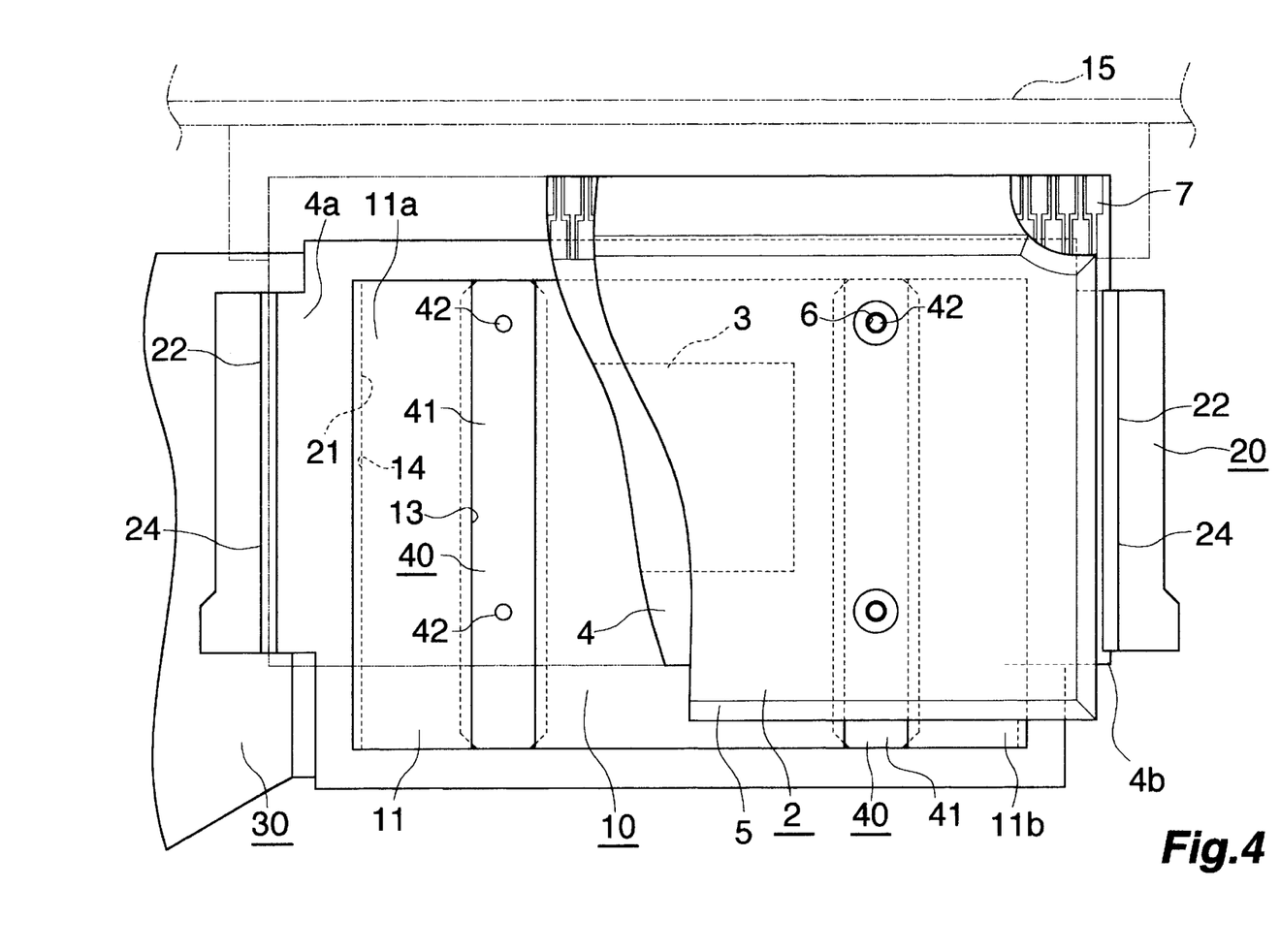
FIG. 4 is an enlarged plan view partly broken away and showing the same.

With reference to FIGS. 2 to 4 showing the heat sink device of the invention in detail, the circuit board 4 and the cover 5 of the CPU assembly 2 each have four holes 6 at required portions. These holes 6, 6 have a diameter, for example, of 3 mm. Upright pin portions 42, 42, 2 mm in diameter, of the fastening members 40 to be described later are inserted through the holes 6, 6.

The heat sink 10 comprises a heat dissipating base plate 11 in the form of a rectangular aluminum extrudate which is elongated from the front rearward when seen from above, and tonguelike fins (radiating fins) 12 which are curved in when seen from the front and formed in parallel on the lower surface of the base plate in a raised form by cutting.

The base plate 11 of aluminum extrudate is provided in its upper surface with a pair of front and rear internally enlarged slots 13, 13 extending in the direction of extrusion of the base plate 11 for fitting respective fastening members 40, 40 therein. These slots 13, 13 serve to prevent the fastening members 40, 40 from shifting (laterally)). The front and rear ends of the base plate 11 are provided in the lower edges thereof with respective stepped portions 14, 14 engageable with the front and rear edge portions of the mount frame member 20.

The tonguelike fins 12 are formed on the lower surface of the heat dissipating base plate 11 by cutting to a raised form at right angles with the slots 13, 13, in other words, at right angles with the direction of extrusion of the base plate 11. Such fins 12 can be given a desired fin pitch and can be arranged at a small interval to achieve a high radiation efficiency. The fins 12 have another advantage that the fins can be formed in a desired direction irrespective of the direction of extrusion of the base plate 11.

The mount frame member 20 of aluminum extrudate has an opening 21 for the lower half of the base plate 11 of the heat sink 10 to fit in. The frame member 20 has upright walls 22, 22 projecting upward respectively from the front and rear edge portions thereof and opposed to each other. Each upright wall 22 has at its upper end an engaging projection 24 and a fitting furrow 23 extending along the projection 24 thereunder.

On the other hand, the fastening member 40 comprises a striplike base 41, and two upright pin portions 42, 42 each projecting upward from a lengthwise intermediate portion of the base 41 and having a diameter, for example, of 3 mm.

Figure 5:
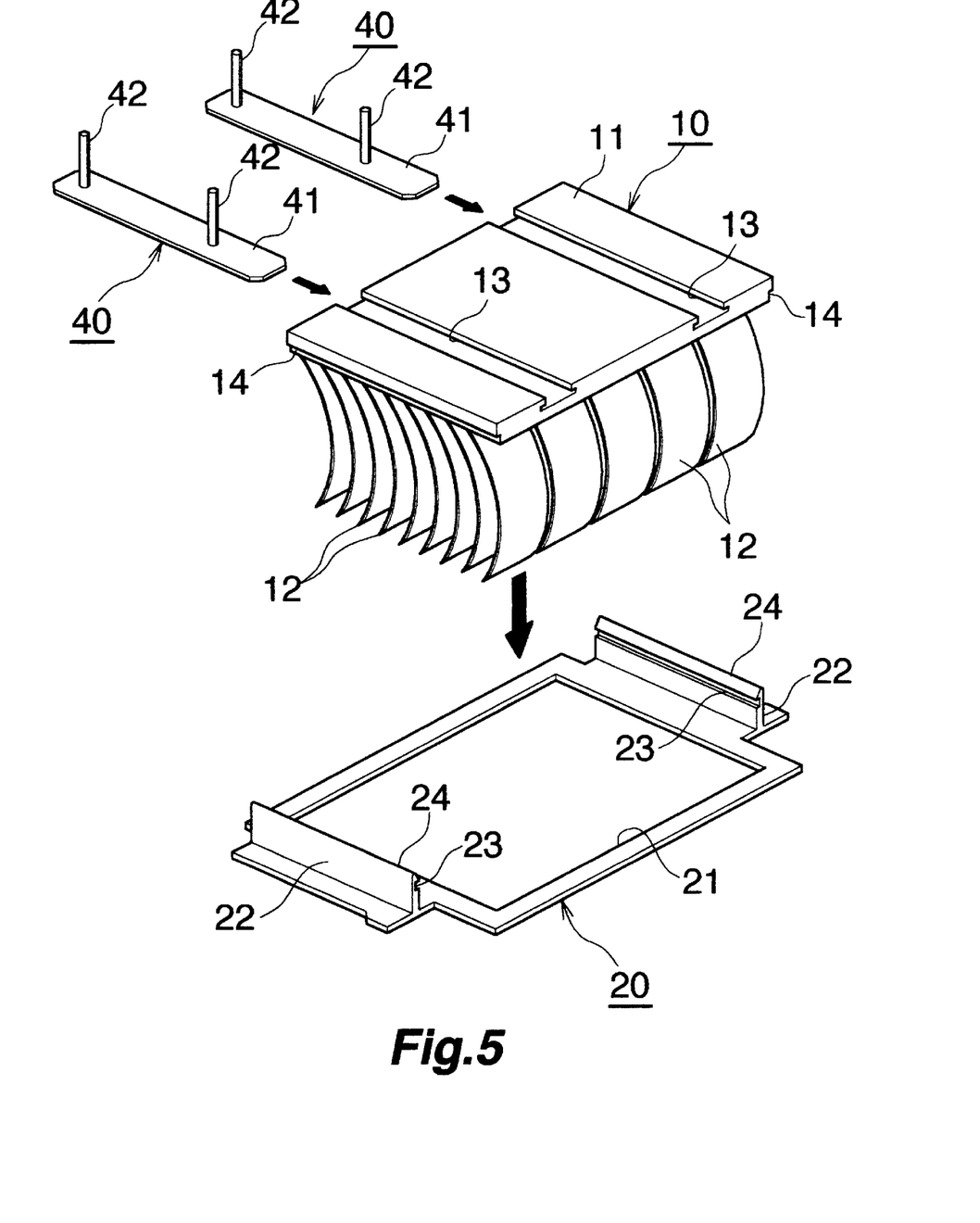
FIG. 5 is an exploded perspective view showing a heat sink, mount frame member and fastening members included in the heat sink device of FIG. 2.

To assemble the CPU assembly 2, heat sink 10 and mount frame member 20, the striplike bases 41, 41 of the fastening members 40, 40 are first slidingly inserted into the respective two front and rear slots 13, 13 in the upper surface of the heat sink base plate 11 as shown in FIG. 5, each through one end of the slot 13.

The radiating fins 12 of the heat sink 10 are then inserted through the opening 21 in the frame member 20 from above to fit the lower half of the base plate 11 into the opening 21 and engage the stepped portions 14, 14 at the front and rear ends 11b, 11a of the base plate 11 respectively with the front edge and the rear edge defining the opening 21 of the frame member 20.

Figure 6:
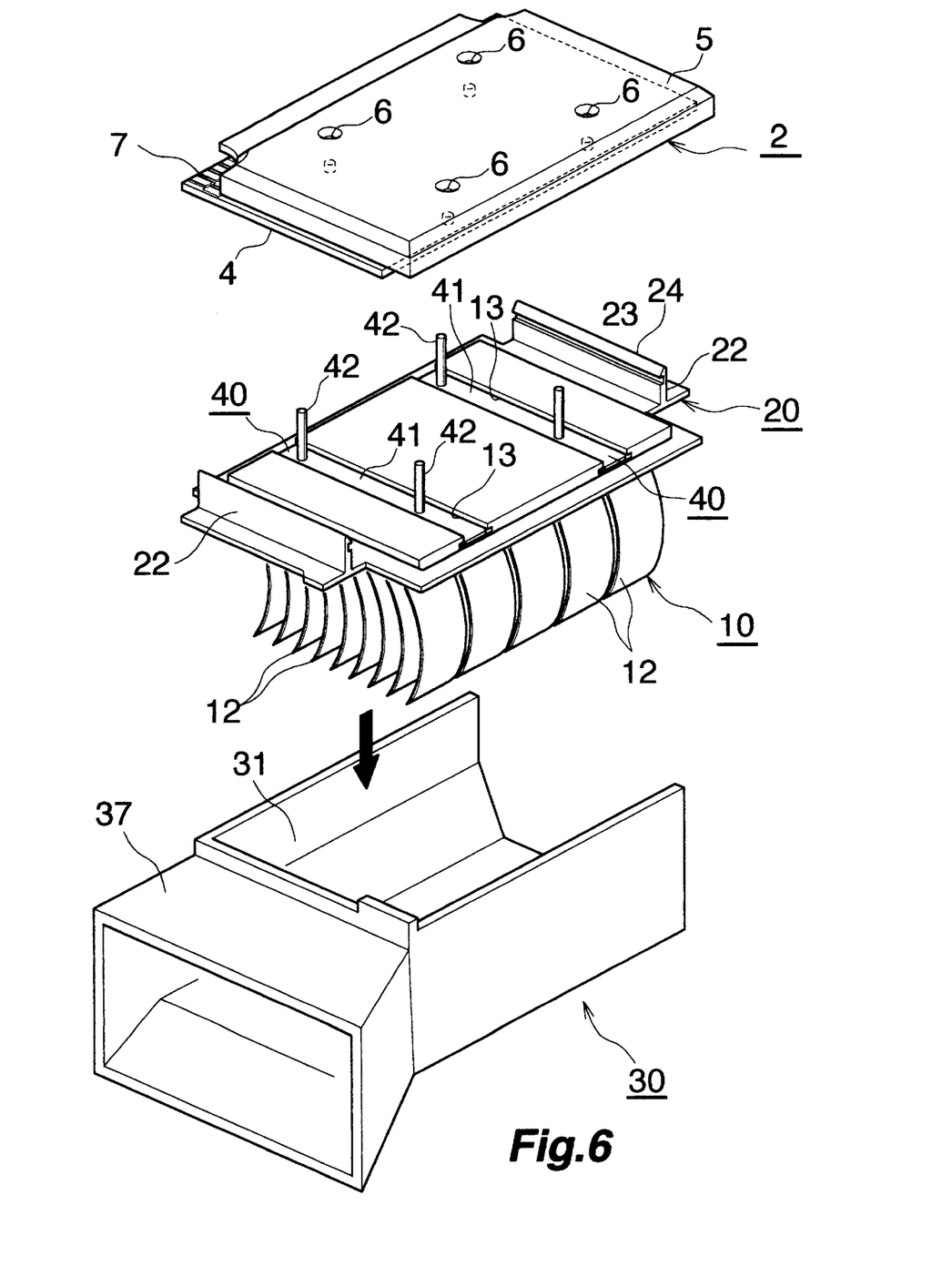
FIG. 6 is an exploded perspective view of a CPU assembly and a duct in combination with the components of the heat sink device of FIG. 5.

The CPU assembly 2 is further placed on the upper surface of the heat sink 10 as shown in FIG. 6. At this time, the four upright pin portions 42, 42 of the front and rear fastening members 40, 40 are inserted from below through the respective four holes 6, 6 formed in the CPU assembly 2, and the front and rear side edges 4b, 4a of the CPU circuit board 4 are pressed from above against the respective engaging projections 24, 24 at the upper ends of the front and rear upright walls 22, 22 of the frame member 20, the projections 24 being hook-shaped in cross section. The engaging projections 24, 24 in turn are temporarily forced outward against the resilience of the material of the upright walls 22, 22 by being pushed by the opposite side edges 4a, 4b of the board 4. Consequently, the opposite side edges 4a, 4b of the board 4 are forced down beyond the hook-shaped engaging projections 24, 24 to fit into the furrows 23, 23 and fixedly engaged with the projections 24, 24. In this way, the heat dissipating base plate 11 of the heat sink 10 as embraced by the mount frame member 20 is attached to the CPU assembly 2.

The internally enlarged slots 13, 13 in the upper surface of the heat dissipating base plate 11 of the heat sink 10 have a depth larger than the thickness of the striplike bases 41, 41 of the fastening members 40, 40 so that the bases 41, 41 can be positioned as fitted in the slots 13, 13. With the bases 41, 41 of the fastening members 40, 40 fitted in the slots 13, 13 of the base plate 11, the upper surface of the base plate 11 of the heat sink 10 is held in intimate contact with the CPU 3 exposed at the lower surface of the CPU assembly 2, consequently assuring a very high radiation efficiency.

Further because the four upright pin portions 42, 42 of the front and rear fastening members 40, 40 are inserted from below through the four holes 6, 6 formed in the CPU assembly 2, the holes to be formed in the CPU circuit board 4 of the CPU assembly 2 or the heat sink 10 can be made as small as possible to diminish the drilling space needed for the circuit board 4, hence a great advantage in design. The four upright pin portions 42, 42 of the fastening members 40, 40 are unlikely to project outward beyond the outer surface of the CPU assembly 2. This ensures compactness.

The heat sink 10 having the CPU assembly 2 thus attached thereto and the mount frame member 20 are fitted to an opening portion 31 in the upper side of the duct 30, with the fins 12 facing downward so as to fit into the duct 30, and the frame member 20 is fixed to the duct with unillustrated means (see FIGS. 2 and 3).

A connecting terminal 7 is provided at a right side edge portion of the CPU assembly 2. The duct 30 having the heat sink 10 and the CPU assembly 2 attached thereto is attached to a specified portion of interior of the housing 1, whereby the terminal 7 of the CPU assembly 2 is connected to a motherboard 15 disposed at the same side as the terminal within the housing 1.

In the arrangement described above, the fan 8 provided in the heat release opening 1a of the rear wall of the housing 1 of the disktop personal computer is operated, whereby the air of low temperature outside the housing 1 is taken in through the air inlet 9 of the housing front wall. The air of low temperature is guided into the heat sink 10 within the duct 30 between the tonguelike fins 12, and the heat generated by the CPU 3 is dissipated through the base plate 11 and the fins 12 to heat the air. The air heated is rapidly released from the housing 1 to the outside through the heat release opening 1a in the housing rear wall by the operation of the fan 8. Accordingly, the fins 12 achieve a very high radiation efficiency.

The tonguelike fins 12 are formed on the lower surface of the heat dissipating base plate 11 by cutting to a raised form at right angles with the slots 13, 13, i.e., at right angles with the direction of extrusion of the base plate 11. Consequently, the air flows through the duct 30 along the fins 12, i.e., in a direction at right angles with the direction of extrusion of the base plate 11.

In the case of the heat sink device of the first embodiment, the CPU assembly 2 comprising a CPU 3 can be installed on the upper surface of the heat dissipating base plate 11 of the heat sink 10 very easily and firmly with extremely great strength, with the CPU 3 in direct contact with the upper surface of the base plate 11. Moreover, the fastening members 40 for attaching the CPU assembly 2 to the heat sink 10 are simple in shape.

Furthermore, the heat sink 10 having the CPU assembly 2 attached thereto is fitted to the opening portion 31 in the upper side of the duct 30, with the tonguelike fins 12 directed downward to fit in the duct 30, so that the heat generated by the CPU 3 is released into the duct 30 through the base plate 11 and fins 12 to heat the air within the duct 30. The operation of the fan 8 rapidly discharges the heated air from the housing 1 to the outside, whereby an exceedingly high cooling efficiency is achieved.

Especially according to the present embodiment, the heat sink 10 serves as part of the wall of the duct 30. This eliminates the clearance between the heat sink 10 and the duct 30 almost completely, permitting the heat sink 10 to be exposed to a sufficient quantity of air flow and thereby achieving a very high radiation efficiency.

According to the foregoing first embodiment, the heat sink 10 is provided with two fastening members 40 each having a pair of upright pin portions 42, whereas only one fastening member 40 may be attached to the heat sink 10.

Next, FIGS. 7 to 11 show a second embodiment of the present invention.

This embodiment differs from the first embodiment in the means for connecting the CPU assembly 2, heat sink 10 and mount frame member 20.

Figure 7:
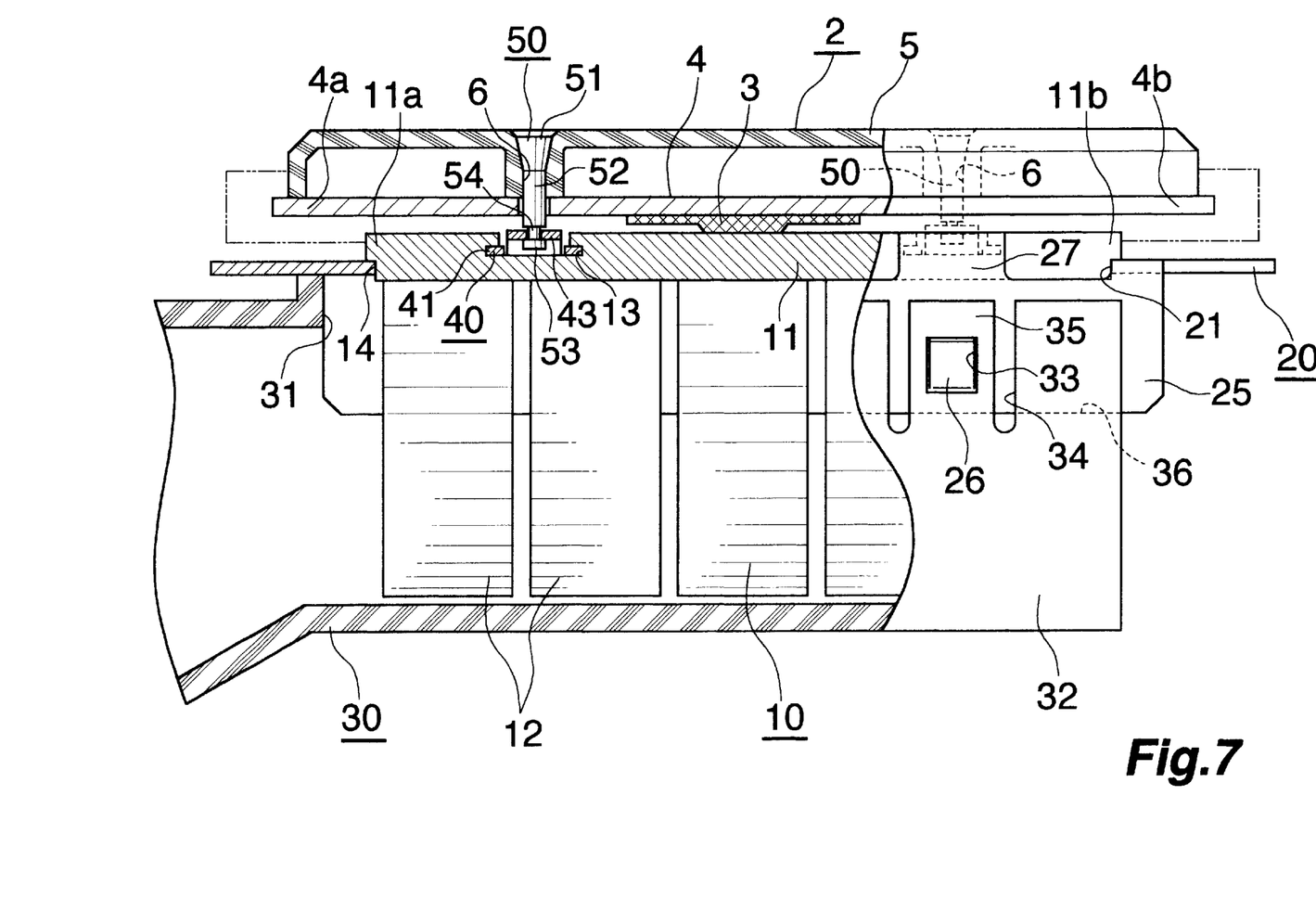
FIG. 7 is an enlarged view in longitudinal section showing a second embodiment of heat sink device of the invention.
Figure 8:
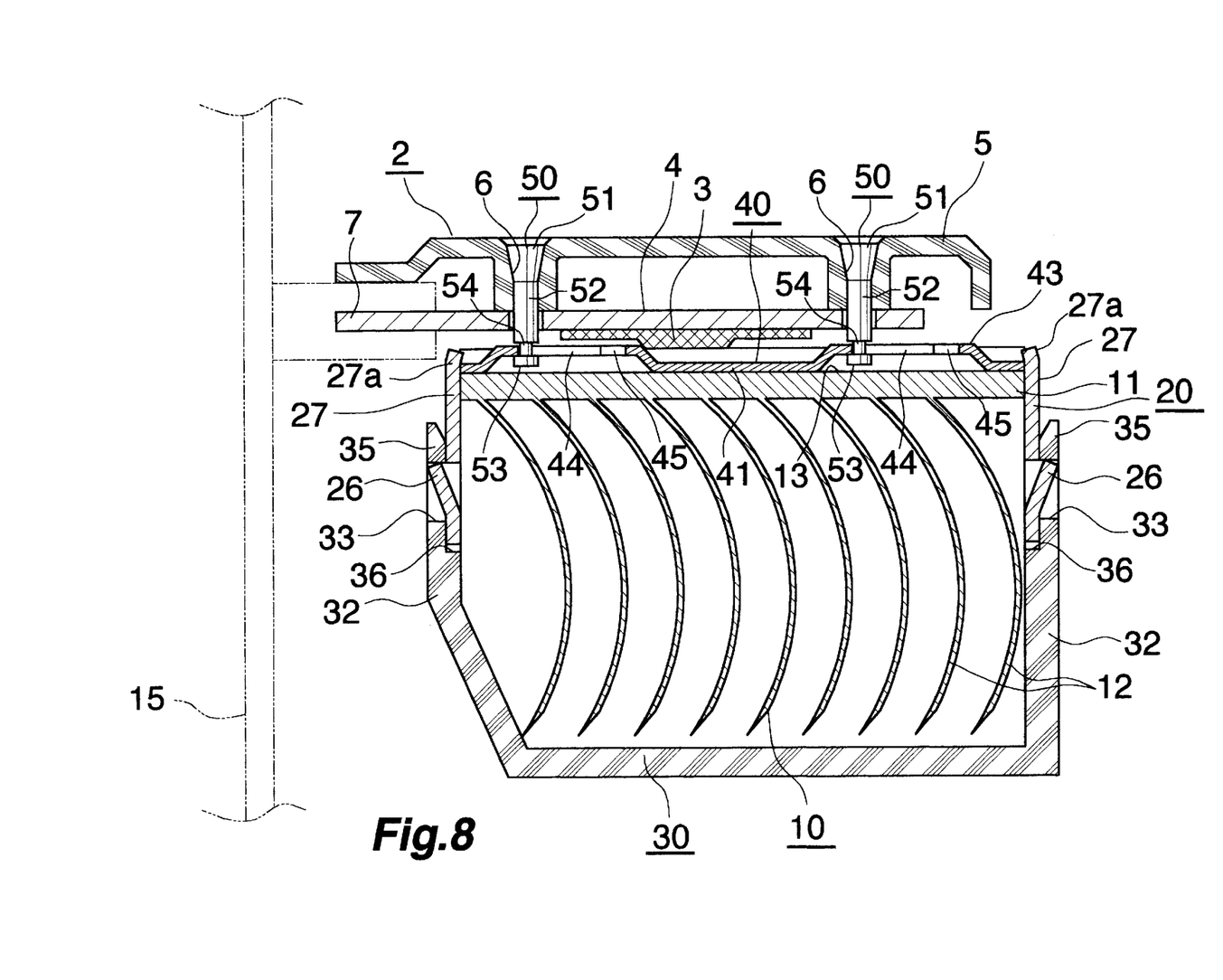
FIG. 8 is an enlarged view in cross section of the same.
Figure 9:
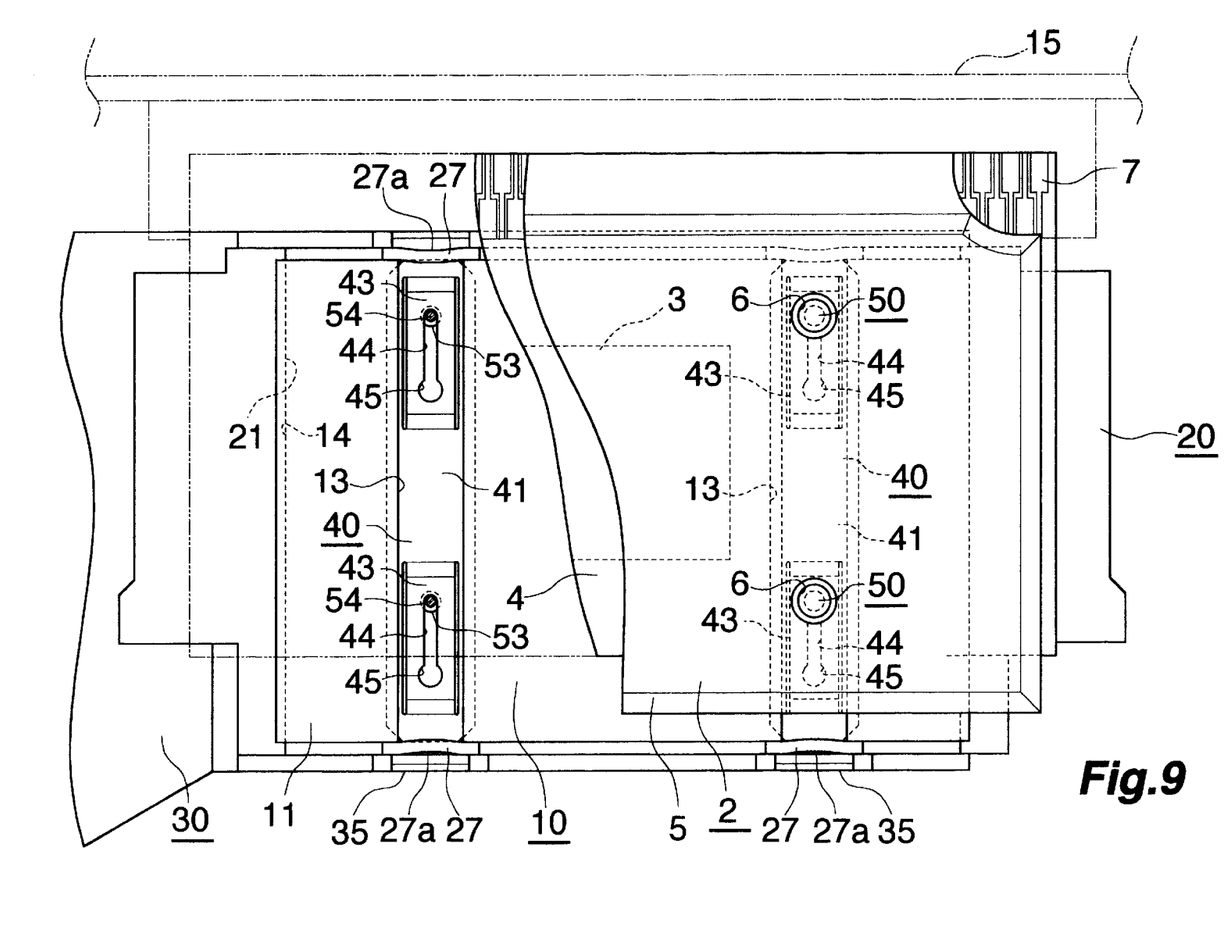
FIG. 9 is an enlarged plan view partly broken away and showing the same.

First with reference to FIGS. 7 to 9, a CPU assembly 2 has holes 6 each comprising a tapered hole portion 6a formed in the upper half of a cover 5, a vertical hole portion extending downward from the hole portion 6a and having a diameter, for example, of 3 mm, and a circular hole portion formed in a CPU circuit board 4 and having the same diameter.

A connecting pin 50 which is to be inserted in each hole 6 of the CPU assembly 2 has a tapered head 51 fittable in the tapered hole portion 6a, a shank 52 in the form of a round rod, extending downward from the head 51 and having a diameter, for example, of 2 mm, and an engaging head 53 formed at the lower end of the shank 52 and similarly having a diameter of 2 mm, with a neck 54 of reduced diameter provided between the shank and the head 53.

On the other hand, fastening members 40, 40 to be fitted into two internally enlarged slots 13, 13 formed in the upper surface of heat dissipating base plate 11 of the heat sink 10 are made of a spring steel plate and each have a striplike base 41, which has left and right two protuberant portions 43, 43 extending longitudinally thereof. Each protuberant portion 43 has formed in its top a slit 44 and a circular hole 45 communicating with the left end of the slit 44 and having a large diameter.

A mount frame member 20 which is to be fitted to the base plate 11 of the heat sink 10 is provided with engaging projections 27, 27 projecting upward from the upper edges of opposite side walls 25, 25 thereof for closing the left and right ends of the two slots 13, 13 of the base plate 10, respectively.

The mount frame member 20, which is made of metal, has an opening 21 in which the lower half of the heat sink base plate 11 is fittable. The engaging projections 27, 27 upwardly projecting from the upper edges of the vertical left and right side walls 25, 25 for closing the opposite ends of the slots 13, 13 in the base plate 11 are four in total number.

The side walls 25, 25 of the frame member 20 are slitted at positions immediately below the projections 27 to provide engaging lugs 26, 26.

On the other hand, the duct 30 is provided in its upper side with an opening portion 31 for fitting the heat sink 10 therein. The opening portion 31 is provided at its left and right sides with vertical side walls 32, 32 each having two pairs of cutouts 34, 34 which are open upward and formed in the upper edge thereof. The pair of cutouts 34, 34 provide therebetween a movable piece 35 which is movable owing to the resiliency of the duct material. A rectangular aperture 33 in which the engaging lug 26 is engageable is formed in the movable piece 35. The opposite side walls 32, 32 of the duct 30 have stepped portions 36, 36 formed in their inner surfaces and engageable with respective opposite side lower edges of the heat sink base plate 11.

Figure 10:
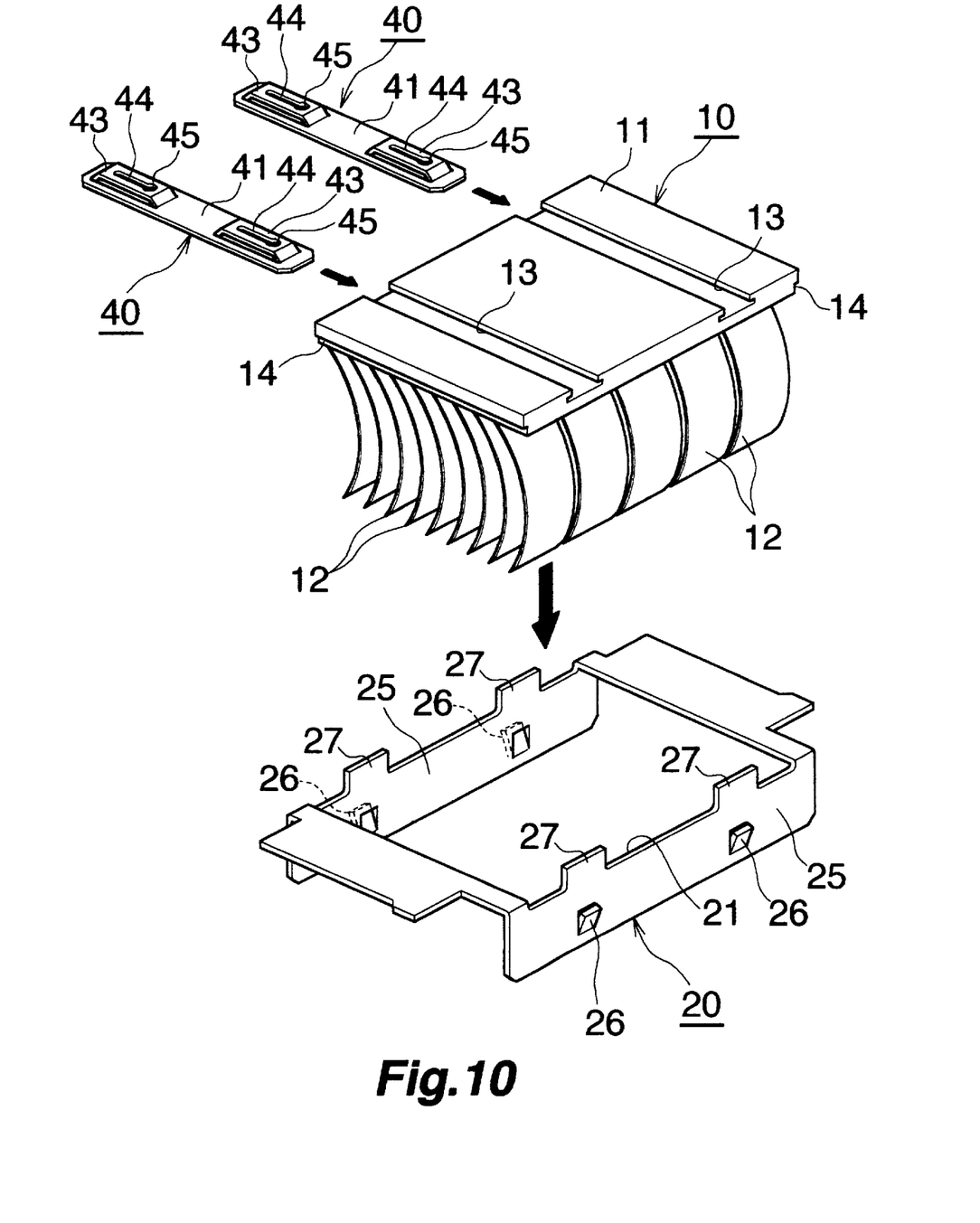
FIG. 10 is an exploded perspective view showing a heat sink, mount frame member and fastening members included in the heat sink device of FIG. 7.

To assemble the CPU assembly 2, heat sink 10, mount frame member 20 and duct 30 in the form of a rectangular tube, the striplike bases 41, 41 of the fastening members 40, 40 are first slidingly inserted into the respective two front and rear slots 13, 13 in the upper surface of the heat sink base plate 11 as shown in FIG. 10, each through one end of the slot 13.

The radiating fins 12 of the heat sink 10 having the fastening member 40, 40 attached thereto are then inserted through the opening 21 in the frame member 20 from above to fit the lower half of the base plate 11 into the opening 21 and engage stepped portions 14, 14 at the front and rear ends 11b, 11a of the base plate 11 respectively with the front edge and the rear edge defining the opening 21 of the frame member 20. At this time, the opposite ends of the slots 13, 13 in the heat dissipating base plate 11 are closed with the respective four engaging projections 27, 27 at the upper edges of the vertical side walls 25, 25 of the frame member 20, whereby the fastening members 40, 40 are prevented from slipping off transversely of the base plate 11.

Figure 11:
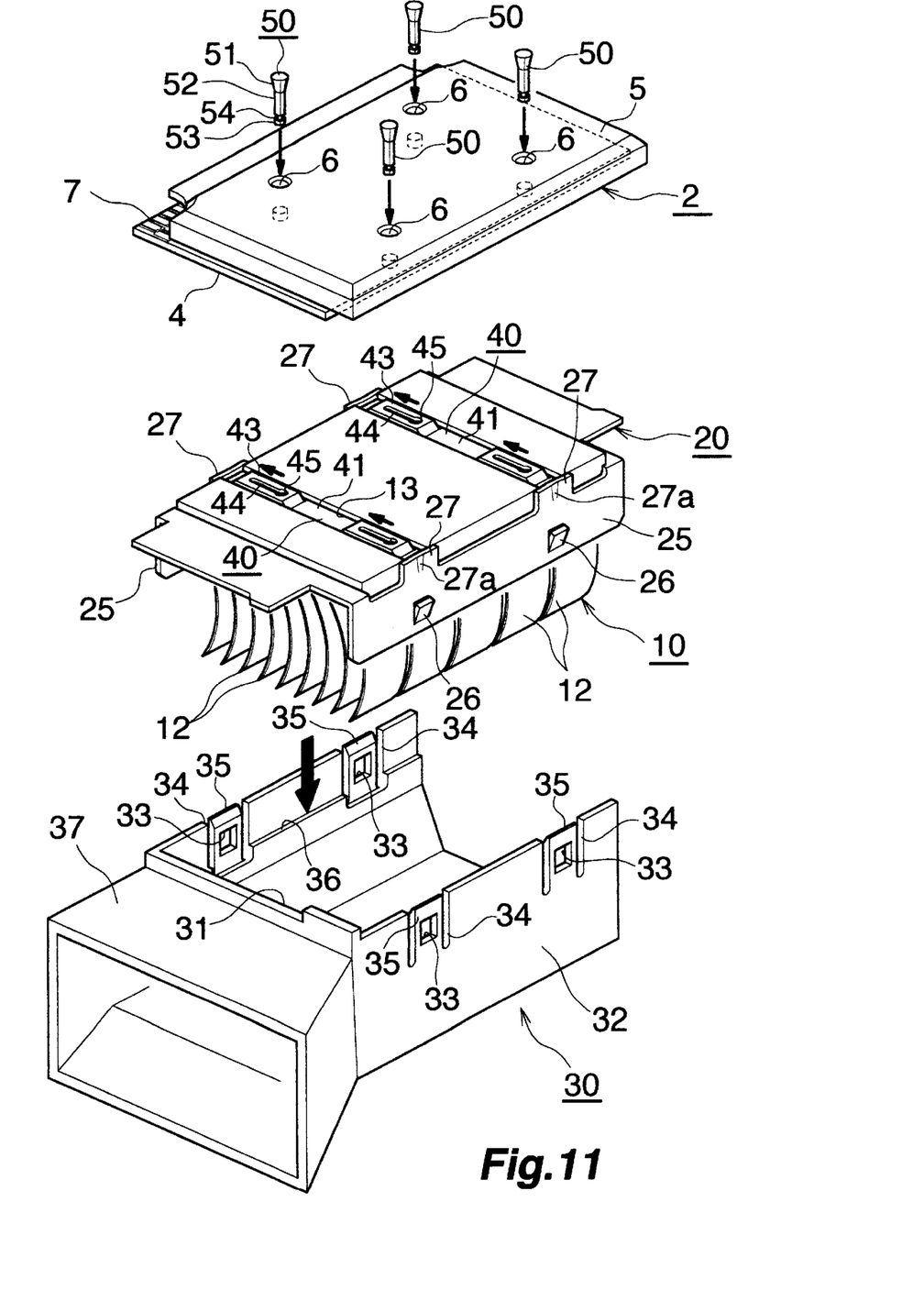
FIG. 11 is an exploded perspective view of a CPU assembly and a duct in combination with the components of the heat sink device of FIG. 10.

Subsequently as shown in FIG. 11, the engaging projections 27, 27 formed on the upper edges of opposite side walls 25, 25 of the mount frame member 20 and closing the opposite ends of slots 13 of the heat sink base plate 11 are deformed (crimped) by being pressed inward and are partly forced into the respective ends of the slots 13. The base plate 11 and the mount frame member 20 are connected together by these deformed inward projections 27a, 27a.

As shown in the same drawing, the connecting pins 50 are then inserted respectively into the four holes 6, 6 of the CPU assembly 2 from above, whereby the tapered head 51 of each connecting pin 50 is fitted into the tapered hole portion 6a in the upper half of the hole 6, preventing the pin 50 from slipping out of the hole downward, and the lower end of shank 52, the neck 54 of reduced diameter and the engaging head 53 at the lower end of the pin 50 are caused to project downward beyond the circuit board 4 of the CPU assembly 2.

The CPU assembly 2 having the connecting pins thus attached thereto is placed on the upper surface of the heat dissipating base plate 11 of the heat sink 10, and the engaging heads 53 at the lower ends of the connecting pins 50 are inserted into the respective circular holes 45 of large diameter in the protuberant portions 43 of the fastening member bases 41, thereafter moved toward the slits 44 and each fixedly engaged by opposite side edges of the slitted portion 44 of the fastening member 40.

Preferably, the fastening members 40 are made of a spring steel plate, such that the fastening members are so deformed as to be slightly raised by the engaging heads 53 at the lower ends of the connecting pins 50, causing the resulting restoring resilient force of the fastening members 40 to hold the CPU 3 at the bottom of the CPU assembly 2 firmly in direct contact with the upper surface of the heat sink base plate 11 (see FIGS. 7 and 8).

The heat sink 10 having the CPU assembly 2 attached thereto and the mount frame member 20 are fitted to the opening portion 31 in the upper side of the duct 30, with the fins 12 directed downward so as to fit into the duct 30. The four engaging lugs 26 on the opposite side walls 25, 25 of the mount frame member 20 are engaged respectively in the corresponding apertures 33 in the opposite side walls 32, 32 of the duct opening portion, whereby the heat sink 10 and the CPU assembly 2 are fixed to the duct 30 by means of the frame member 20.

According to the second embodiment, the CPU assembly 2 comprising a CPU 3 can be installed on the upper surface of the heat dissipating base plate 11 of the heat sink 10 very easily and firmly, with the CPU 3 in direct contact with the upper surface of the base plate 11, hence great convenience.

Since the heat sink 10 serves as part of the wall of the duct 30, almost no clearance is formed between the heat sink 10 and the duct 30. This permits the heat sink 10 to be exposed to a sufficient quantity of air flow to achieve a very high radiation efficiency.

Further because the connecting pins 50 are inserted from above through the four holes 6, 6 formed in the CPU assembly 2, the holes to be formed in the CPU circuit board 4 of the CPU assembly 2 or in the heat sink 10 can be made as small as possible to diminish the drilling space needed for the circuit board 4, hence a great advantage in design. The four connecting pins 50 are unlikely to project outward beyond the outer surface of the CPU assembly 2. This ensures compactness.

The CPU assembly 2, heat sink 10, mount frame member 20 and duct 30 described can be assembled by fixing the CPU assembly 2 to the heat sink 10 with the fastening members 40 and connecting pins 50, further deforming the engaging projections 27, 27 of the frame member 20 closing the opposite ends of front and rear slots 13, 13 of the heat sink 10 to press the projections into the ends of the slots 13, 13 and to hold the opposite ends of the fastening members 40, 40 to the frame member 20 with the inwardly deformed projections 27a, 27a, and finally fitting the heat sink 10 having the CPU assembly 2 attached thereto and the frame member 20 to the opening portion 31 in the upper side of the duct 30, with the tonguelike fins 12 fitted in the duct 30 and with the lugs 26 of the frame member 20 engaged in the respective apertures 33 in the duct 30. Thus, the CPU assembly 2, heat sink 10, frame member 20 and duct 30 can be assembled by a very simple procedure.

Especially according to the second embodiment, the CPU assembly 2, heat sink 10 and mount frame member 20 can be reliably attached to the one side of the duct 30 disposed within the housing 1 of an electronic device. The heat sink serving as part of the duct wall eliminates the clearance to be otherwise formed between the heat sink and the duct, consequently permitting a sufficient quantity of air to flow through the heat sink to achieve a high radiation efficiency. Moreover, the equipment for attaching the heat sink to one side of the duct can be simple to result in a reduction in manufacturing cost.

Since the fastening members 40, 40 inserted in the slots 13, 13 in the heat sink 10 are held in place at their opposite ends by deforming the engaging projections 27, 27 of the frame member 20 at positions away from the tonguelike fins 12 so as to press the projections into the ends of the slots 13, 13, the equipment needed can be more simple than in the case of the conventional method wherein the fastening members are deformed by being pressed at positions closer to the radiating fins, hence the advantage of lower equipment cost.

According to the second embodiment described, the CPU assembly 2 is connected to the heat sink 10 by the four connecting pins 50 in combination with the fastening members 40, whereas the connection may be made with use of the two connecting pins 50 in combination with the fastening member 40.

Further according to the second embodiment described, the engaging lugs 26, 26 are provided on the opposite side walls 25, 25 of the mount frame member 20, and the engaging apertures 33, 33 are formed in upper edge portions of vertical opposite side walls 32, 32 of the duct 30, whereas the lug 26 and the aperture 33 are provided relative to each other for engagement. Conversely, therefore, the apertures 33, 33 may be formed in the opposite side walls 25, 25 of the frame member 20 in combination with the lugs 26, 26 provided on the vertical opposite side walls 32, 32 of the duct 30.

According to the first and second embodiments described, the slots 13, 13 of base plate 11 of the heat sink 10 may be formed in one of the upper and lower surfaces of the base plate 11, with the tonguelike fins 12 provided on the other surface. Although the radiating fins formed on the base plate 11 are tonguelike as illustrated, the radiating fins may be shaped otherwise, for example, in the form of comb teeth or pins made of extrudate.

Although the CPU 3 is attached as exposed to the lower surface of the circuit board 4 of the CPU assembly 2 of the cartridge type in the first and second embodiments, the CPU 3 may be incorporated in the CPU assembly 2 of the cartridge type. In this case, the lower surface of the circuit board 4 of the CPU assembly 2 is held in direct contact with the upper surface of the base plate 11 of the heat sink 10.

What is claimed is:

1. A heat sink device for releasing the heat generated by a CPU assembly disposed in a housing of an electronic device to the outside of the housing, the heat sink device for the electronic device being characterized in that a heat dissipating base plate of a heat sink has radiating fins on a lower surface of the base plate and a slot formed in an upper surface of the base plate and extending transversely thereof, a mount frame member being fitted to the base plate and provided with upright walls projecting upward respectively from front and rear opposite edge portions thereof and opposed to each other, the front and rear upright walls being each provided at an upper end portion thereof with an engaging projection and a fitting furrow positioned under and extending along the engaging projection, a fastening member having a striplike base fitted in the slot of the base plate of the heat sink and pinlike projections each projecting upward from a longitudinal intermediate portion of the striplike base, the radiating fins of the heat sink being inserted from above through an opening of the mount frame member to fit a lower half portion of the base plate into the opening, the base plate being provided at front and rear ends thereof with stepped portions engaged respectively with a front edge and a rear edge of the mount frame member defining the opening thereof, the CPU assembly being placed on the upper surface of the base plate of the heat sink, the fastening member having each of the pinlike projections thereof inserted from below through a hole in the CPU assembly, a circuit board of the CPU assembly having front and rear edge portions fixedly engaged with the respective engaging projections of the front and rear upright walls of the mount frame member while being fitted in the respective fitting furrows of the upright walls.

2. A heat sink device for releasing the heat generated by a CPU assembly disposed in a housing of an electronic device to the outside of the housing, the heat sink device for the electronic device being characterized in that a heat dissipating base plate of a heat sink has radiating fins on a lower surface of the base plate and a slot formed in an upper surface of the base plate and extending transversely thereof, a mount frame member being fitted to the base plate and provided with engaging projections projecting upward from respective upper edges of opposite side walls thereof for closing opposite ends of the slot in the base plate respectively, a fastening member having a striplike base fitted in the slot of the base plate of the heat sink and provided with protuberant portions, each of the protuberant portions having in a top part thereof a slit extending longitudinally thereof and a circular hole having a large diameter and communicating with one end of the slit, connecting pins being inserted through respective holes in the CPU assembly while being prevented from slipping off downward, each of the connecting pins having at a lower end thereof an engaging head projecting downward beyond a circuit board of the CPU assembly, the radiating fins of the heat sink being inserted from above through an opening of the mount frame member to fit a lower half portion of the base plate into the opening, an upper half portion of the base plate having a front edge and a rear edge engaged respectively with a front edge and a rear edge of the mount frame member defining the opening thereof, the engaging projections at the upper edges of the opposite side walls of the mount frame member being pressed inward and thereby deformed while closing the opposite ends of the slot of the heat sink base plate so as to be partly positioned in the respective slot ends and to connect the base plate to the mount frame member by the inwardly deformed projections, the CPU assembly having the connecting pins attached thereto and being placed on the upper surface of the heat sink base plate, the engaging head of each connecting pin being moved toward the slit in the protuberant portion of the fastening member base after the engaging head is inserted into the circular hole in the protuberant portion, whereby the engaging head of the pin is held by the fastening member in engagement therewith.

* * * * *